(12) United States Patent
Nakayama

(10) Patent No.: US 8,364,422 B2
(45) Date of Patent: Jan. 29, 2013

(54) METHOD OF PRESUMING INTERIOR SITUATION OF PROCESS CHAMBER AND STORAGE MEDIUM

(75) Inventor: Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 658 days.

(21) Appl. No.: 12/472,702

(22) Filed: May 27, 2009

(65) Prior Publication Data

US 2009/0299652 A1    Dec. 3, 2009

Related U.S. Application Data

(60) Provisional application No. 61/088,741, filed on Aug. 14, 2008.

(30) Foreign Application Priority Data

May 30, 2008 (JP) ................................. 2008-142805

(51) Int. Cl.
*G06F 17/17* (2006.01)
*G06F 17/18* (2006.01)

(52) U.S. Cl. .......................................... 702/26; 438/905

(58) Field of Classification Search .................... 702/26; 438/905

See application file for complete search history.

(56) References Cited

U.S. PATENT DOCUMENTS

| | | | |
|---|---|---|---|
| 4,928,537 A * | 5/1990 | Liu et al. | 73/863.86 |
| 6,924,157 B1 * | 8/2005 | Phan et al. | 438/8 |
| 7,416,635 B2 * | 8/2008 | Moriya et al. | 156/345.34 |
| 7,458,247 B2 | 12/2008 | Moriya et al. | |
| 7,464,581 B2 | 12/2008 | Moriya et al. | |
| 2003/0147075 A1 * | 8/2003 | Otsuki et al. | 356/338 |
| 2005/0193027 A1 * | 9/2005 | Hasegawa et al. | 707/200 |
| 2007/0137792 A1 | 6/2007 | Moriya et al. | |
| 2008/0121517 A1 * | 5/2008 | Nitschke | 204/192.13 |
| 2009/0053835 A1 | 2/2009 | Moriya et al. | |

FOREIGN PATENT DOCUMENTS

| | | |
|---|---|---|
| JP | 8-5542 | 1/1996 |
| JP | 2005-317900 | 11/2005 |

OTHER PUBLICATIONS

Japanese Office Action mailed on Apr. 24, 2012, issued for JP Application No. 2008-142805, filed on May 30, 2008.

* cited by examiner

*Primary Examiner* — Cindy H Khuu
*Assistant Examiner* — Alexander Satanovsky
(74) *Attorney, Agent, or Firm* — Oblon, Spivak, McClelland, Maier & Neustadt, L.L.P.

(57) ABSTRACT

A method of presuming interior situation of process chamber that makes it possible to accurately presume the interior situation of a process chamber using the number of particles discharged from the interior of the process chamber. Characteristic values associated with respective particle removing modes of a particle removing sequence are extracted from time-series data on the number of particles discharged from the interior of the process chamber in which a substrate is accommodated and subjected to predetermined processing and to which the particle removing sequence is applied, and the relationship between the extracted characteristic values and the interior situation of the process chamber is calculated. The interior situation of the process chamber is presumed based on the calculated relationship and the characteristic values in new time-series data on the number of particles.

11 Claims, 9 Drawing Sheets

FIG.5

| THRESH-OLD | CHARACTER-ISTIC ITEM | FIRST | | SECOND | | THIRD | |
|---|---|---|---|---|---|---|---|
| | | CHARACTER-ISTIC VALUE | NUMBER OF PARTICLES | CHARACTER-ISTIC VALUE | NUMBER OF PARTICLES | CHARACTER-ISTIC VALUE | NUMBER OF PARTICLES |
| 1 | STARTING POINT | 2 | 36 | 3 | 34 | 1 | 37 |
| | ENDING POINT | 50 | | 49 | | 52 | |
| | INTEGRATED TIME PERIOD | 38 | | 37 | | 41 | |
| | NUMBER OF TIMES | 5 | | 4 | | 5 | |
| 2 | STARTING POINT | 4 | | 4 | | 3 | |
| | ENDING POINT | 46 | | 41 | | 48 | |
| | INTEGRATED TIME PERIOD | 18 | | 16 | | 22 | |
| | NUMBER OF TIMES | 4 | | 3 | | 4 | |

FIG.7

| THRESHOLD | CHARACTERISTIC ITEM | SIGANL | S/N RATIO |
|---|---|---|---|
| 1 | STARTING POINT | MEDIUM | MEDIUM |
| | ENDING POINT | SMALL | SMALL |
| | INTEGRATED TIME PERIOD | LARGE | LARGE |
| | NUMBER OF TIMES | SMALL | SMALL |
| 2 | STARTING POINT | MEDIUM | MEDIUM |
| | ENDING POINT | SMALL | SMALL |
| | INTEGRATED TIME PERIOD | LARGE | LARGE |
| | NUMBER OF TIMES | SMALL | SMALL |

METHOD OF PRESUMING INTERIOR SITUATION OF PROCESS CHAMBER AND STORAGE MEDIUM

BACKGROUND OF THE INVENTION

1. Field of the Invention

The present invention relates to a method of presuming interior situation of process chamber and a storage medium, and in particular relates to a method of presuming interior situation of process chamber that presumes the interior situation of process chamber in which a wafer is accommodated and subjected to predetermined processing.

2. Description of the Related Art

There is known a substrate processing apparatus that has a process chamber in which a wafer as a substrate is accommodated and subjected to predetermined processing, for example, plasma processing. In the substrate processing apparatus, if predetermined processing is repeatedly carried out, particles arising from, for example, plasma processing become attached to surfaces of component parts inside the process chamber. It is necessary to remove these particles on a regular basis because they cause troubles in semiconductor devices manufactured from wafers.

Conventionally, dry cleaning has been frequently used as a method of removing particles from the interior of the process chamber. In the dry cleaning, particles are removed by, for example, sputtering surfaces of component parts using plasma produced from oxygen gas. In the dry cleaning, it is difficult to completely remove particles, and dry cleaning takes much effort because it is necessary to produce plasma. For this reason, in recent years, an NPPC (non plasma particle cleaning) sequence has been used as a method that does not use plasma (see, for example, Japanese Laid-open Patent Publication (Kokai) No. 2005-317900).

In the NPPC sequence, particles are separated from component parts and discharged from the process chamber using a gas impact force, a gas viscous force, and an electrostatic force. In general, the NPPC sequence is comprised of a gas impact force mode in which a predetermined gas, for example, $N_2$ gas is suddenly introduced into the process chamber so as to produce a gas impact force, a gas viscous force mode in which the pressure in the process chamber is controlled to a predetermined pressure so as to produce a gas viscous force from the introduced $N_2$ gas, and an electrostatic force mode in which a DC voltage is applied to the component parts so as to produce an electrostatic force between the particles and the component parts.

In the case that particles are removed from the interior of the process chamber by the dry cleaning or the NPPC sequence, it is necessary to recognize the interior situation of the process chamber, for example, the degree to which particles have been removed from the interior of the process chamber, and for this reason, the number of particles discharged from the process chamber (hereinafter referred to as "discharged particles") is counted. Specifically, an exhaust pipe that communicates with the process chamber is provided with an ISPM (in-situ particle monitor) that detects particles using scattered light so as to count the number of particles flowing in the exhaust pipe. For example, if the number of particles counted by the ISPM reaches 0, it is presumed that almost all particles have been removed from the interior of the process chamber.

Moreover, if a problem or a particular event occurs in the process chamber, this has different effects on the respective modes of the NPPC sequence (specifically, the number of particles removed in each mode changes), and hence recognizing the number of discharged particles in each mode is considered very useful in presuming the interior situation of the process chamber.

However, the numbers of particles removed in the respective modes are superposed in the number of particles counted by the ISPM, and it is thus difficult to recognize the number of discharged particles in each mode. That is, there may be a case where the number of discharged particles counted by the ISPM when the NPPC sequence is carried out does not accurately reflect a problem occurring in the process chamber.

For example, in an experiment that was conducted by the present inventors before developing the present invention, the correlation coefficient between the number of discharged particles counted by the ISPM when the NPPC sequence was carried out and the number of particles attached to a surface of a wafer accommodated in the process chamber was as low as 0.0448.

It is thus difficult to accurately presume the interior situation of the process chamber even if the number of discharged particles counted by the ISPM is used as it is.

SUMMARY OF THE INVENTION

The present invention provides a method of presuming interior situation of process chamber and a storage medium that make it possible to accurately presume the interior situation of a process chamber using the number of particles discharged from the interior of the process chamber.

Accordingly, in a first aspect of the present invention, there is provided a method of presuming interior situation of process chamber that presumes an interior situation of a process chamber in which a substrate is accommodated and subjected to predetermined processing and to which a particle removing sequence comprising a plurality of particle removing modes is applied, comprising a relationship calculating step of extracting characteristic values associated with the respective particle removing modes from time-series data on the number of particles discharged from an interior of the process chamber, and calculating a relationship between the extracted characteristic values and the interior situation of the process chamber and an interior situation presuming step of presuming the interior situation of the process chamber based on the calculated relationship and the characteristic values in new time-series data on the number of particles.

According to the first aspect of the present invention, characteristic values associated with the respective particle removing modes are extracted from time-series data on the number of particles discharged from the interior of the process chamber, the relationship between the extracted characteristic values and the interior situation of the process chamber is calculated, and further, the interior situation of the process chamber is presumed based on the calculated relationship and the characteristic values in new time-series data on the number of particles. The characteristic values associated with the respective particle removing modes prominently represent the characteristics of the concerned modes, and hence the interior situation of the process chamber is presumed using the characteristic values that prominently represent the characteristics of the modes. Thus, the effects of the superposition of the numbers of particles removed in the respective modes on the presumption of the interior situation can be reduced, and as a result, the interior situation of the process chamber can be accurately presumed using the number of particles discharged from the interior of the process chamber.

The first aspect of the present invention can provide a method of presuming interior situation of process chamber, wherein the interior situation of the process chamber is the number of particles attached to a surface of the substrate.

According to the first aspect of the present invention, the number of particles attached to the surface of the substrate can be accurately presumed using the number of particles discharged from the interior of the process chamber.

The first aspect of the present invention can provide a method of presuming interior situation of process chamber, wherein the plurality of particle removing modes include a mode using a gas impact force, a mode using a gas viscous force, and a mode using an electrostatic force and the characteristic values are the number of times the time-series data exceeds a predetermined threshold value, a time at which the time-series data exceeds the predetermined threshold value for the first time, a time at which the time-series data last becomes smaller than the predetermined threshold value, and an integrated time period for which the time-series data exceeds the predetermined threshold value.

According to the first aspect of the present invention, the plurality of particle removing modes include the mode using a gas impact force, the mode using a gas viscous mode, and the mode using an electrostatic force, and the characteristic values are the number of times the time-series data exceeds the predetermined threshold value, a time at which the time-series data exceeds the predetermined threshold value for the first time, a time at which the time-series data last becomes smaller than the predetermined threshold value, and an integrated time period for which the time-series data exceeds the predetermined threshold value. A large amount of particles are discharged in an initial stage in the mode using a gas impact force, particles are continuously discharged for a relatively long time period in a mode using a gas viscous force, and particles are intermittently discharged for a relatively long time period in the mode using an electrostatic force, and therefore, the mode using a gas impact force is related in particular to a time at which the time-series data exceeds the predetermined threshold value for the first time, the mode using a gas viscous force is related in particular to a time at which the time-series data exceeds the threshold value for the first time, a time at which the time-series data last becomes smaller than the predetermined threshold value, and an integrated time period for which the time-series data exceeds the predetermined threshold value, and the mode using an electrostatic force is related in particular to a time at which the time-series data exceeds the predetermined threshold value for the first time, a time at which the time-series data last becomes smaller than the predetermined threshold value, and the number of times the time-series data exceeds the predetermined threshold value. Thus, by using these characteristic values, the effects of the superposition of the numbers of particles removed in the respective modes on the presumption of the interior situation can be reliably eliminated.

The first aspect of the present invention can provide a method of presuming interior situation of process chamber, wherein a plurality of predetermined threshold values are set.

According to the first aspect of the present invention, because a plurality of predetermined threshold values are set, the number of kinds of characteristic values for use in presuming the interior situation can be increased, and as a result, the statistical reliability of the presumption can be improved.

The first aspect of the present invention can provide a method of presuming interior situation of process chamber, wherein in the relationship calculating step, variations in the relationship between the characteristic values and the interior situation of the process chamber are calculated, and in the interior situation presuming step, the greater the calculated variations become, the lower the evaluations are given to the interior situation of the process chamber presumed based on the relationship and the characteristic values in the new time-series data on the number of particles.

According to the first aspect of the present invention, because the greater the calculated variations become, the lower the evaluations are given to the interior situation of the process chamber presumed based on the relationship between the characteristic values and the interior situation of the process chamber and the characteristic values in the new time-series data on the number of particles, a low evaluation is given to the interior situation of the process chamber presumed based on characteristic values that are not closely related to the interior situation of the process chamber. Thus, the interior situation of the process chamber is presumed by preferentially using characteristic values that are closely related to the interior situation of the process chamber, and as a result, the accuracy of the presumption can be improved.

Accordingly, in a second aspect of the present invention, there is provided a method of presuming interior situation of process chamber that presumes an interior situation of a process chamber in which a substrate is accommodated and subjected to predetermined processing and to which a particle removing sequence comprising a plurality of particle removing modes is applied, comprising a characteristic value group creating step of extracting characteristic values associated with the respective particle removing modes from time-series data on the number of particles discharged from an interior of the process chamber, and further creating in advance respective groups of the characteristic values in accordance with a plurality of interior situations of the process chamber and an interior situation presuming step of presuming the interior situation of the process chamber based on degrees of consistency between the created groups of the characteristic values and the characteristic values in new time-series data on the number of particles.

According to the second aspect of the present invention, characteristic values associated with the respective particle removing modes are extracted from time-series data on the number of particles discharged from the interior of the process chamber, respective groups of the characteristic values are created in advance in accordance with a plurality of interior situations of the process chamber, and further, the interior situation of the process chamber is presumed based on degrees of consistency between the created groups of the characteristic values and the characteristic values in new time-series data on the number of particles. The characteristic values associated with the associated with the respective particle removing modes particle removing modes prominently represent the characteristics of the concerned modes, and hence the interior situation of the process chamber is presumed using the characteristic values that prominently represent the characteristics of the modes. Thus, the effects of the superposition of the numbers of particles removed in the respective modes on the presumption of the interior situation can be reduced, and as a result, the interior situation of the process chamber can be accurately presumed using the number of particles discharged from the interior of the process chamber.

The second aspect of the present invention can provide a method of presuming interior situation of process chamber, wherein the plurality of interior situations of the process chamber are a normal situation, a situation in which the particles have been suddenly produced, and a situation in which maintenance of the process chamber is required.

According to the second aspect of the present invention, it is possible to accurately presume that the interior situation of the process chamber is one of the following: a normal situation, a situation in which the particles have been suddenly produced, and a situation in which maintenance of the process chamber is required.

The second aspect of the present invention can provide a method of presuming interior situation of process chamber, wherein the plurality of particle removing modes include a mode using a gas impact force, a mode using a gas viscous mode, and a mode using an electrostatic force and the characteristic values are the number of times the time-series data exceeds a predetermined threshold value, a time at which the time-series data exceeds the predetermined threshold value for the first time, a time at which the time-series data last becomes smaller than the predetermined threshold value, and an integrated time period for which the time-series data exceeds the predetermined threshold value.

The second aspect of the present invention can provide a method of presuming interior situation of process chamber, wherein a plurality of predetermined threshold values are set.

The second aspect of the present invention can provide a method of presuming interior situation of process chamber, wherein the degrees of consistency are multidimensional distances between the created groups of the characteristic values and the characteristic values in new time-series data on the number of particles.

According to the second aspect of the present invention, because the degree of consistency is a multidimensional distance between the created groups of the characteristic values and the characteristic values in new time-series data on the number of particles, the interior situation of the process chamber can be easily presumed.

The second aspect of the present invention can provide a method of presuming interior situation of process chamber, wherein in the interior situation presuming step, the presumption of the interior situation of the process chamber based on the degrees of consistency is carried out using an MT method.

According to the second aspect of the present invention, the presumption of the interior situation of the process chamber is carried out based on the degree of consistency using the MT method. Because the MT method has a high statistical reliability, the accuracy with which the interior situation of the process chamber is presumed can be improved.

Accordingly, in a third aspect of the present invention, there is provided a computer-readable storage medium storing a program for causing a computer to carry out a method of presuming interior situation of process chamber that presumes an interior situation of a process chamber in which a substrate is accommodated and subjected to predetermined processing and to which a particle removing sequence comprising a plurality of particle removing modes is applied, the method of presuming interior situation of process chamber comprising a relationship calculating step of extracting characteristic values associated with the respective particle removing modes from time-series data on the number of particles discharged from an interior of the process chamber, and calculating a relationship between the extracted characteristic values and the interior situation of the process chamber and an interior situation presuming step of presuming the interior situation of the process chamber based on the calculated relationship and the characteristic values in new time-series data on the number of particles.

Accordingly, in a fourth aspect of the present invention, there is provided a computer-readable storage medium storing a program for causing a computer to carry out a method of presuming interior situation of process chamber that presumes an interior situation of a process chamber in which a substrate is accommodated and subjected to predetermined processing and to which a particle removing sequence comprising a plurality of particle removing modes is applied, the method of presuming interior situation of process chamber comprising a characteristic value group creating step of extracting characteristic values associated with the respective particle removing modes from time-series data on the number of particles discharged from an interior of the process chamber, and further creating in advance respective groups of the characteristic values in accordance with a plurality of interior situations of the process chamber and an interior situation presuming step of presuming the interior situation of the chamber based on degrees of consistency between the created groups of the characteristic values and the characteristic values in new time-series data on the number of particles.

The features and advantages of the invention will become more apparent from the following detailed description taken in conjunction with the accompanying drawings.

BRIEF DESCRIPTION OF THE DRAWINGS

FIG. 5 is a table showing characteristic values extracted from time-series data and the number of particles on a wafer;

FIG. 7 is a table showing sensitivities and S/N ratios regarding the respective characteristic values;

FIGS. 8A, 8B, and 8C are views showing time-series data on the total number of particles discharged when the NPPC sequence is carried out in the case that the interior situation of the process chamber differs, in which FIG. 8A shows the case that the interior situation of the process chamber is a normal situation, FIG. 8B shows the case that the interior situation of the process chamber is a situation in which particles have been suddenly produced, and FIG. 8C shows the case that the interior situation of the process chamber is a situation in which maintenance of the process chamber is required.

DETAILED DESCRIPTION OF PREFERRED EMBODIMENTS

The present invention will now be described in detail with reference to the drawings showing preferred embodiments thereof.

First, a description will be given of a method of presuming interior situation of process chamber according to a first embodiment of the present invention.

Figure 1:
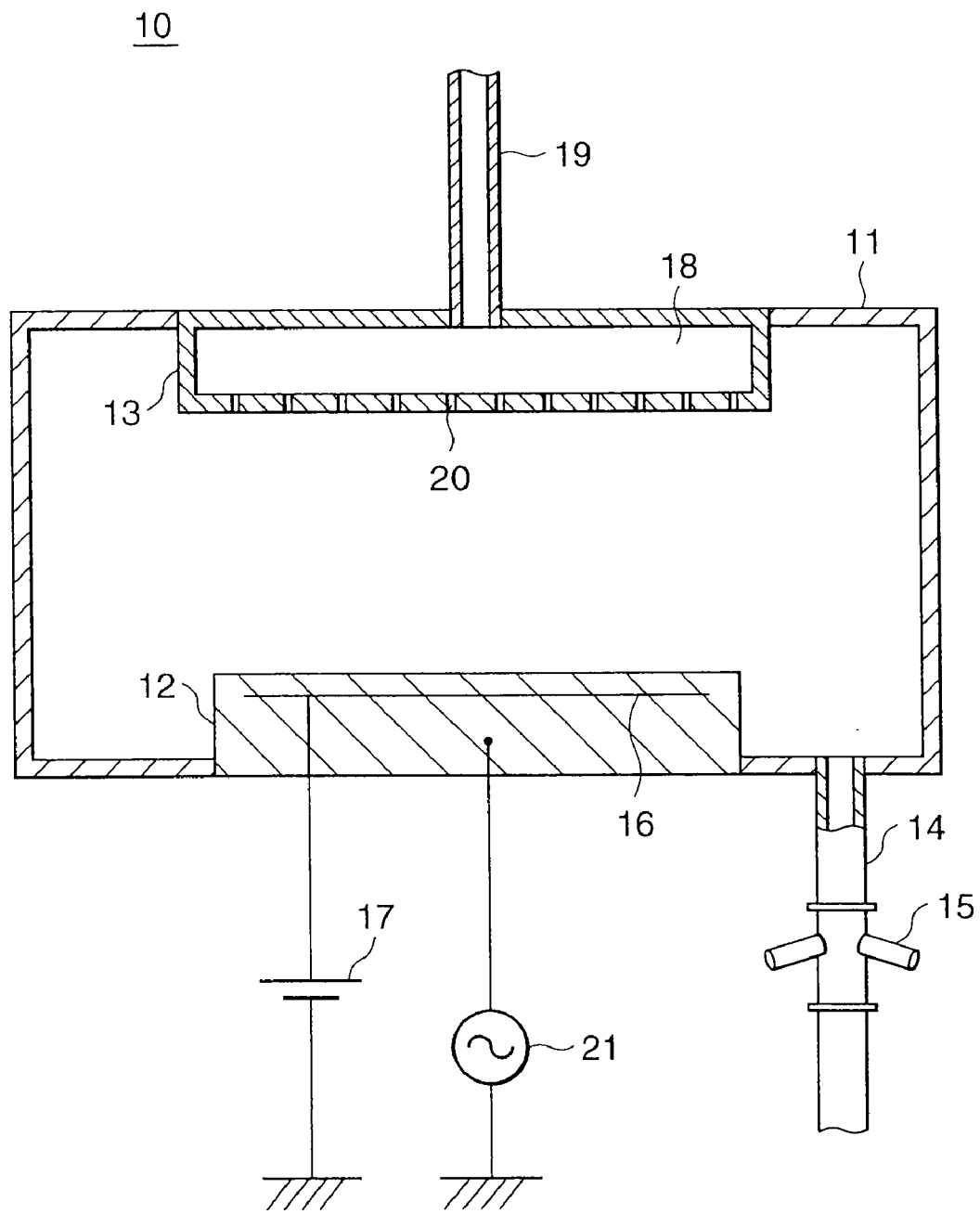
FIG. 1 is a cross-sectional view schematically showing the construction of a substrate processing apparatus having a process chamber to which a method of presuming interior situation of process chamber according to a first embodiment of the present invention is applied.

FIG. 1 is a cross-sectional view schematically showing the construction of a substrate processing apparatus having a process chamber to which the method of presuming interior situation of process chamber according to the present embodiment is applied.

Referring to FIG. 1, the substrate processing apparatus 10 has a process chamber 11 in which a wafer (not shown) as a substrate is accommodated, a mounting stage 12 that is disposed in a lower portion of the process chamber 11 and on which the wafer is mounted, and a showerhead 13 that is disposed inside the process chamber 11 such as to face the mounting stage 12.

The process chamber 11 communicates with an exhaust pipe 14 to which are connected an APC (adaptive pressure control) valve, a DP (dry pump), and a TMP (turbo-molecular pump) (all of which are not shown). The DP roughs the interior of the process chamber 11, and the TMP evacuates the interior of the process chamber 11. The APC valve is an openable and closable valve and controls the pressure in the process chamber 11. An ISPM 15 that detects particles and so on flowing in the exhaust pipe 14 is provided part way along the exhaust pipe 14.

The mounting stage 12 is a cylindrical stage and has an electrostatic electrode plate 16 incorporated in an upper portion thereof. The electrostatic electrode plate 16 is connected to a DC power source 17. Upon a high DC voltage being applied to the electrostatic electrode plate 16, the electrostatic electrode plate 16 attracts and holds the wafer on an upper surface of the mounting stage 12 through an electrostatic force, for example, a Coulomb force. Moreover, a radio frequency power source 21 is connected to the mounting stage 12, and the radio frequency power source 21 applies radio frequency voltage to the mounting stage 12. The mounting stage 12 to which the radio frequency voltage has been applied acts as a lower electrode and applies radio frequency voltage into the process chamber 11.

The showerhead 13 has a buffer chamber 18 incorporated therein, and the buffer chamber 18 communicates with the interior of the process chamber 11 via a plurality of gas holes 20. Moreover, a process gas introducing pipe 19 communicates with the buffer chamber 18, and the process gas introducing pipe 19 supplies a process gas into the process chamber 11 via the buffer chamber 18 and the gas holes 20.

In the substrate processing apparatus 10, after the pressure in the process chamber 11 is reduced, a process gas is introduced into the process chamber 11, and radio frequency voltage is applied into the process chamber 11. At this time, the process gas is excited due to the radio frequency voltage, whereby plasma is produced. The plasma reaches the wafer on the mounting stage 12 to carry out plasma processing, for example, etching processing on the wafer.

In the substrate processing apparatus 10, if the plasma processing is repeatedly carried out, for example, particles arising from the plasma processing become attached to surfaces of component parts in the process chamber 11. An NPPC sequence is used as a chamber cleaning method for removing such particles.

Figure 2:
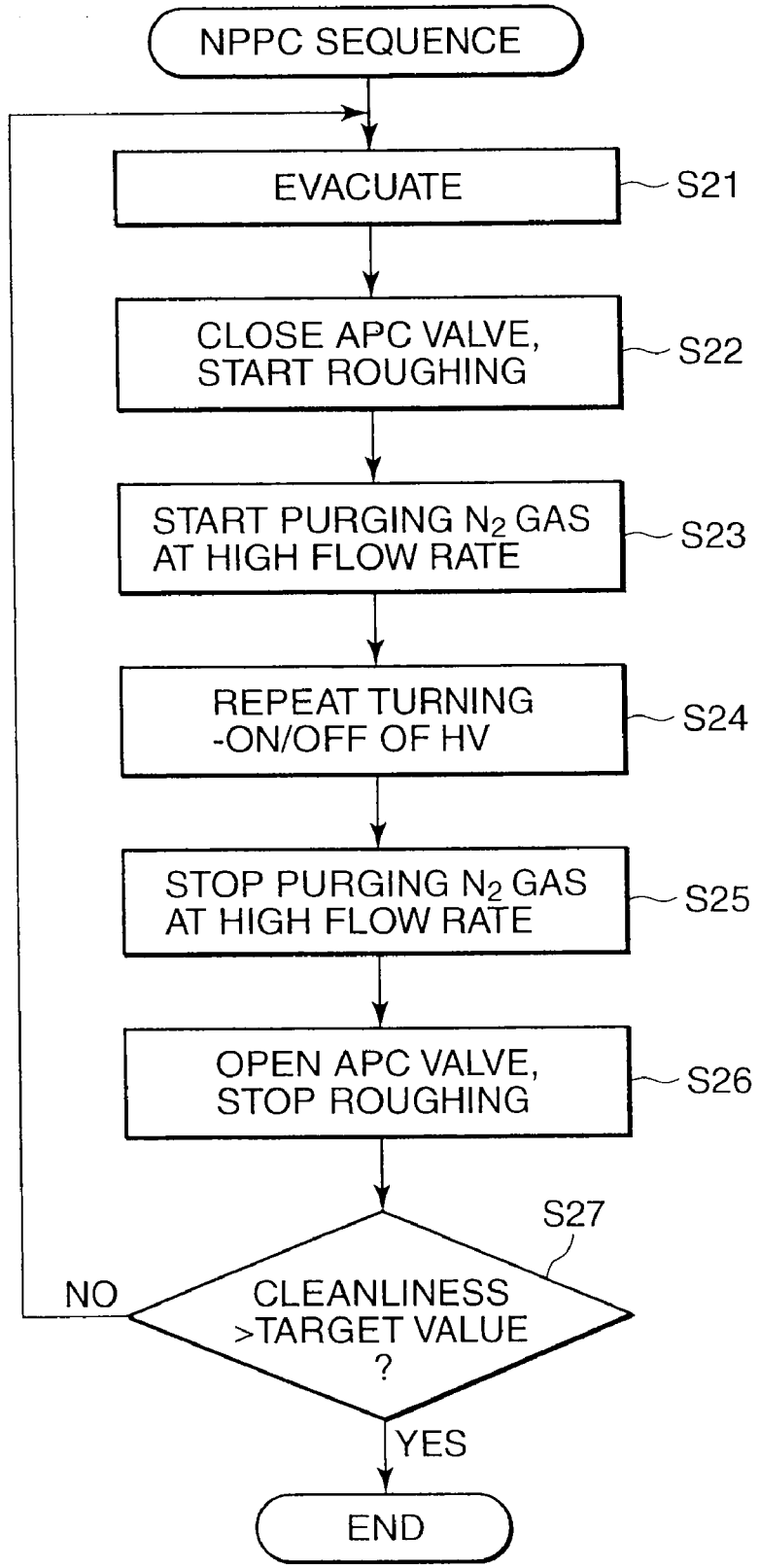
FIG. 2 is a flow chart of an NPPC sequence.

FIG. 2 is a flow chart of the NPPC sequence. In general, the NPPC sequence is carried out on a regular basis in a situation in which no wafer is accommodated in the process chamber 11.

Referring to FIG. 2, first, the APC valve is opened, and the interior of the process chamber 11 is evacuated by the TMP and the DP (step S21). When the pressure in the process chamber 11 has been reduced to a predetermined value, the APC valve is closed, and thereafter, the interior of the process chamber 11 is roughed by only the DP (step S22).

Next, $N_2$ gas is purged at high flow rate from the showerhead 13 to the interior of the process chamber 11 (step S23). At this time, a gas impact wave is produced in the process chamber 11, and when the gas impact wave reaches the surfaces of the component parts, a gas impact force arising from the gas impact wave acts on the particles attached to the surfaces of the component parts, and the particles are separated and flown up from the surfaces of the component parts and then discharged from the exhaust pipe 14 (a particle removing mode using a gas impact force). Moreover, the purging of the $N_2$ gas is continued, and hence a viscous flow of the $N_2$ gas is produced in the process chamber 11. When the viscous flow reaches the surfaces of the component parts, a gas viscous force arising from the viscous flow acts on the particles attached to the surfaces of the component parts, and the particles are separated and flown up from the surfaces of the component parts and then discharged from the exhaust pipe 14 (a particle removing mode using a gas viscous force).

It should be noted that, if the interior of the process chamber 11 is at a predetermined pressure or higher, the viscous flow is apt to be produced, and hence the APC valve controls the pressure in the process chamber 11 so that the pressure in the process chamber 11 does not become lower than, for example, 133 Pa (1 Torr), preferably, several tens of thousands of Pa (several hundreds of Torr).

Here, the gas introduced into the process chamber 11 is not limited to being $N_2$ gas, but has only to be an inert gas, for example, helium (He), neon (Ne), argon (Ar), krypton (Kr), xenon (Xe), or radon (Rn), or $O_2$ gas.

Then, the DC power source 17 repeatedly applies and stops applying high DC voltage (HV) (step S24). At this time, an electrostatic field is produced due to the application of the high voltage to the electrostatic electrode plate 16, and an electrostatic force acts on the surfaces of the component parts of the process chamber 11, whereby the particles are separated and flown up from the surfaces of the component parts and then discharged from the exhaust pipe 14 (a particle removing mode using an electrostatic force).

The electrostatic force mentioned above effectively acts on the surfaces of the component parts when the application of high voltage to the electrostatic electrode plate 16 is started and stopped. Here, in the substrate processing apparatus 10, because the application of high voltage to the electrostatic electrode plate 16 is repeatedly carried out, an effective electrostatic force repeatedly acts on the surfaces of the component parts. As a result, the particles attached to the surfaces of the component parts can be removed.

Then, the purging of the $N_2$ gas from the showerhead 13 at high flow rate is stopped (step S25), and further, the APC valve is opened to stop the roughing using only the DP (step S26).

Then, it is determined whether or not the cleanliness of the process chamber 11 has exceeded a target value (step S27). For example, the number of particles attached to a surface of a wafer accommodated in the process chamber 11 immediately after the NPPC is carried out (hereinafter referred to as "the number of particles on the wafer") is presumed from the number of particles flowing in the exhaust pipe 14, which was counted by the ISPM 15 during the execution of the steps S22 to S24 (hereinafter referred to as "the total number of discharged particles"), and it is determined whether or not the presumed number of particles on the wafer (the interior situation of the process chamber) has become smaller than a target number of particles.

If, as a result of the determination in the step S27, the cleanliness of the interior of the process chamber 11 is more than the target value, the present process is brought to an end, and if the cleanliness of the interior of the process chamber 11 is not more than the target value, the process returns to the step S21.

As described above, the NPPC sequence is comprised of the three particles removing modes, that is, the particle removing mode using a gas impact force (hereinafter referred to as the "gas impact force mode"), the particle removing mode using a gas viscous force (hereinafter referred to as the "gas viscous force mode"), and the particle removing mode using an electrostatic force (hereinafter referred to as the "electrostatic force mode"). Here, as described above, the reason why the correlation coefficient between the total number of discharged particles and the number of particles on the wafer is very low is that the number of particles removed in the gas impact force mode, the number of particles removed in the gas viscous force mode, and the number of particles removed in the electrostatic force mode are superposed in the total number of discharged particles, and even if the number of particles removed in each mode changes due to a particular event occurring in the process chamber 11, the total number of discharged particles does not particularly change.

Figure 3:
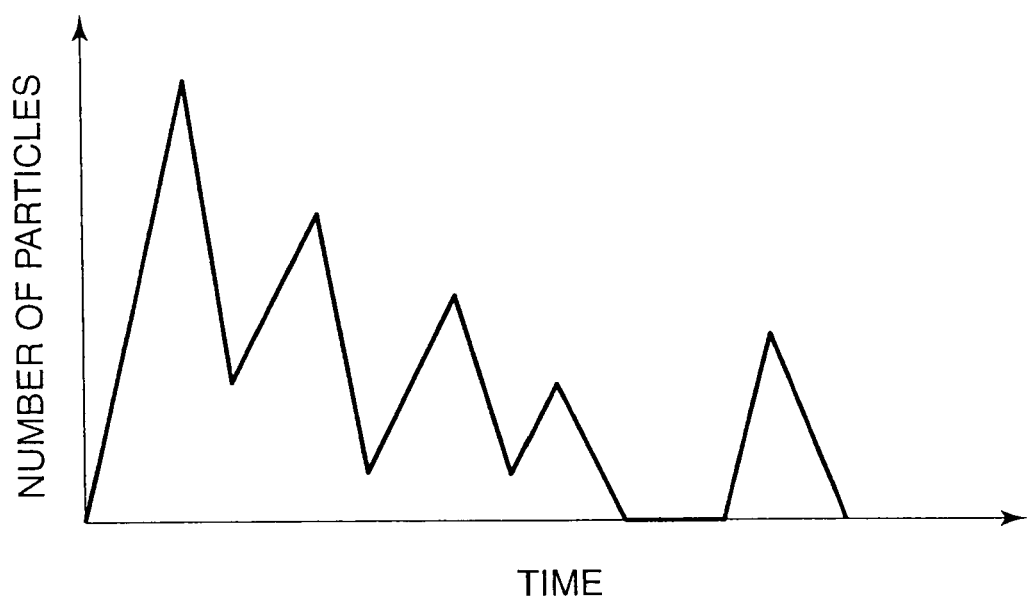
FIG. 3 is a view showing time-series data on the total number of particles discharged when the NPPC sequence is carried out.

Accordingly, the present inventors contemplated reducing the effects of the superposition of the numbers of particles removed in the respective modes. Then, the present inventors observed a large number of time-series data on the total number of discharged particles as shown in FIG. 3 and analyzed particle removing mechanisms in the respective modes. As a result, the present inventors found that the temporal pattern in which removed particles are produced differs according to the modes.

Specifically, the present inventors found that the gas impact force mode is characterized in that a large amount of particles are discharged in an initial stage of the NPPC sequence because particles are removed due to a gas impact wave produced at the moment at which $N_2$ gas is purged into the process chamber 11 at high flow rate, the gas viscous force mode is characterized in that particles are continuously discharged for a relatively long time period in the NPPC sequence because particles are removed due to a viscous flow of $N_2$ gas purged continuously into the process chamber 11, and the electrostatic force mode is characterized in that particles are intermittently discharged for a relatively long time period in the NPPC sequence because particles are removed due to high voltage applied intermittently to the electrostatic electrode plate 16.

Then, the present inventors found out that if characteristic values that prominently represent the characteristics of the patterns in which particles to be removed in the respective modes are produced (characteristic values associated with the respective particle removing modes) are extracted from time-series data on the total number of discharged particle, and by using the extracted characteristic values, the effects of the superposition of the numbers of particles removed in the respective modes can be reduced.

In the present embodiment, in time-series data on the total number of discharged particles, a threshold value indicative of a predetermined number of particles is set, and a plurality of characteristic values mentioned above are extracted using the threshold value as a reference.

Figure 4:
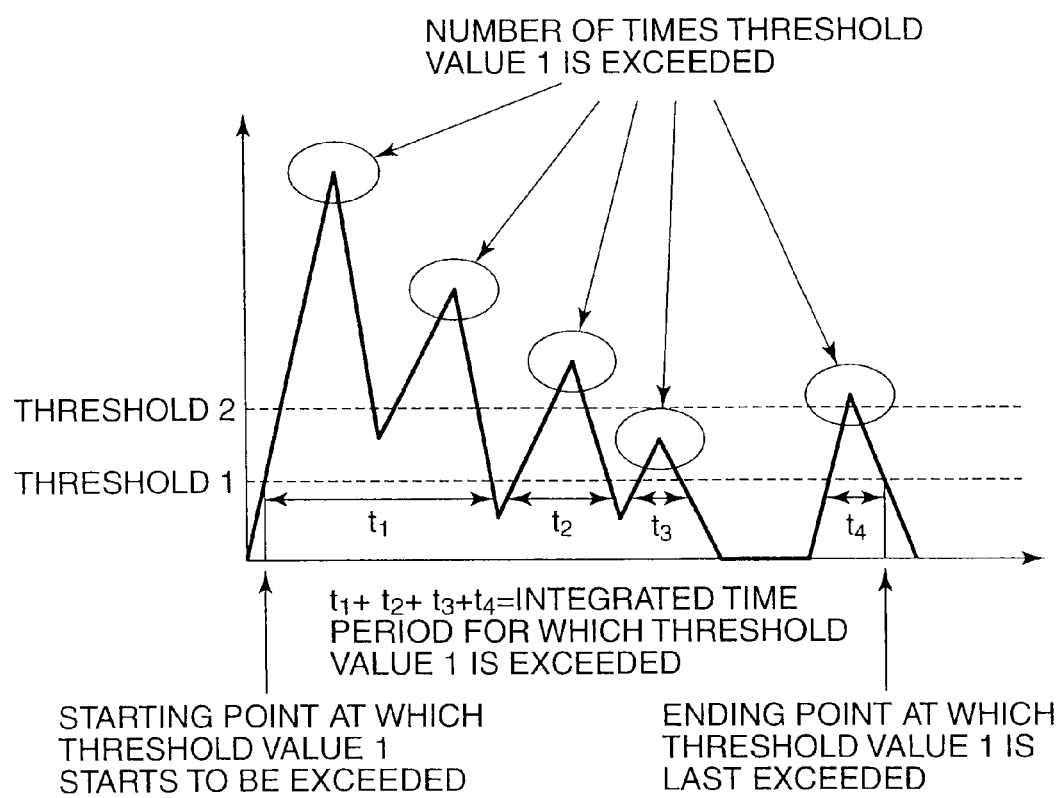
FIG. 4 is a view showing characteristic values that prominently represent the characteristics of the patterns in which particles to be removed in modes of the NPPC sequence are produced.

FIG. 4 is a view showing characteristic values that prominently represent the characteristics of the patterns in which particles to be removed in the respective modes of the NPPC sequence are produced. It should be noted that axes of the ordinate and the abscissa in FIG. 4 correspond to those in FIG. 3, and a threshold value 1 and a threshold value 2 are set as threshold values, but in the following description, mention will be made only of the threshold value 1 for the convenience of explanation.

The gas impact force mode is related to a time at which time-series data on the total number of discharged particles (hereinafter referred to merely as the "time-series data") exceeds a threshold value for the first time ("starting point at which threshold value 1 starts to be exceeded" in the figure) because a large amount of particles are discharged in an initial stage of the NPPC sequence, the gas viscous force mode is related to a time at which the time-series data exceeds the threshold value for the first time ("starting point at which threshold value 1 starts to be exceeded" in the figure), a time at which the time-series data last becomes smaller than the threshold value ("ending point at which threshold value 1 is last exceeded" in the figure), and an integrated time period for which the time-series data is greater than the threshold value ("integrated time period for which threshold value 1 is exceeded" in the figure) because particles are continuously discharged for a relatively long time period in the NPPC sequence, and the electrostatic force mode is related to a time at which the time-series data exceeds the threshold value for the first time ("starting point at which threshold value 1 starts to be exceeded" in the figure), a time at which the time-series data last becomes smaller than the threshold value ("ending point at which threshold value 1 is last exceeded" in the figure), and the number of times the time-series data exceeds the threshold value ("number of times threshold value 1 is exceeded" in the figure) because particles are intermittently discharged for a relatively long time period in the NPPC sequence.

Thus, in the present embodiment, for example, a starting point at which the threshold value starts to be exceeded, an ending point at which the threshold value is last exceeded, an integrated time period for which the threshold value is exceeded, and the number of times the threshold value is exceeded are extracted as characteristic values.

FIG. 5 is a table showing the characteristic values extracted from the time-series data and the number of particles on the wafer. It should be noted that in FIG. 5, a "threshold value 1" and a "threshold value 2" are set as threshold values, and a starting point at which the threshold value starts to be exceeded, an ending point at which the threshold value is last exceeded, an integrated time period for which the threshold value is exceeded, and the number of times the threshold value is exceeded are simply expressed as "starting point", "ending point", "integrated time period", "number of times", and "number of particles", respectively.

In order to presume the number of particles on the wafer using the characteristic values, it is necessary to calculate the correlative relationship between the characteristic values and the number of particles on the wafer. Here, because a plurality of data are needed so as to calculate the correlative relationship, a plurality of starting points at which the threshold value starts to be exceeded, a plurality of ending points at which the threshold value is last exceeded, a plurality of integrated time periods for which the threshold value is exceeded, and a plurality of numbers of times the threshold value is exceeded are extracted from a plurality of time-series data under the same conditions. For example, as shown in FIG. 5, the NPPC sequence is carried out three times under the same conditions, the total number of discharged particles is counted in each of the NPPC sequence, and three characteristic values are extracted from the first, second, and third time-series data.

Figure 6:
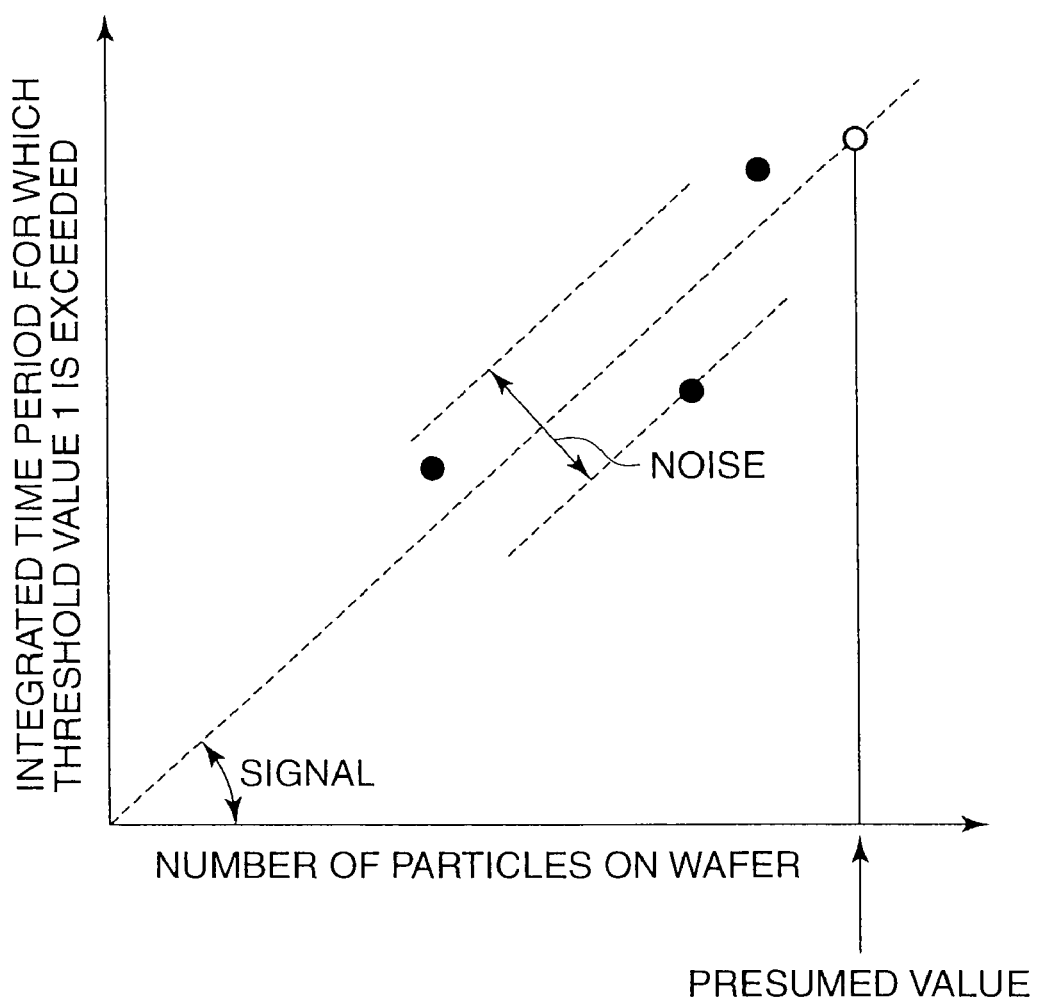
FIG. 6 is a view showing an example of the correlative relationship between a characteristic value and the number of particles on a wafer.

FIG. 6 is a graph showing an example of the correlative relationship between a characteristic value and the number of particles on the wafer. In FIG. 6, "integrated time for which threshold value 1 is exceeded" is assumed as a characteristic value.

As shown in FIG. 6, integrated times periods for which the threshold value 1 is exceeded and the numbers of particles corresponding to the respective integrated time periods for which the threshold value 1 is exceeded are plotted on a two-dimensional graph (indicated by "•" in the figure), and the correlative relationship between the respective integrated times periods for which the threshold value 1 is exceeded and the numbers of particles on the wafer, for example, a sensitivity (signal) as a gradient and a variation (noise) are calculated.

The above described calculation of the correlative relationship is carried out for all the characteristic values, and a sensitivity and an S/N ratio as the ratio of a sensitivity to a variation are calculated for each of the characteristic values (relation calculating step) (see a table of FIG. 7).

The above described procedure is carried out until the number of particles on the wafer is presumed, for example, when the NPPC sequence is carried out for the first time after the substrate processing apparatus 10 is installed.

Thereafter, in the NPPC sequence that is carried out after the plasma processing is carried out a predetermined number of times, time-series data on the total number of discharged particles (hereinafter referred to as the "new time-series data") is obtained by the ISPM 15, and the number of particles on the wafer is presumed based on the characteristic values in the new time-series data (characteristic values in the time-series data on a new number of particles) and the already calculated correlative relationships between the characteristic values and the number of particles on the wafer.

For example, regarding the integrated time period for which the threshold value 1 is exceeded, as shown in FIG. 6, it is assumed that the current "integrated time period for which the threshold value 1 is exceeded" exists on a correlative line having an already calculated gradient (indicated by a dotted line in the figure), the current "integrated time period for which the threshold value 1 is exceeded" is plotted on the correlative line (indicated by "○" in the figure), and the "number of particles on wafer" corresponding to the plotted current "integrated time period for which the threshold value 1 is exceeded" is read. Then, the read "number of particles on wafer" is regarded as a presumed value.

Here, because a plurality of characteristic values are obtained from time-series data, presumed values of particles on the wafer are obtained for the respective characteristic values. In the present embodiment, a plurality of presumed values of particles on the wafer are integrated using the following equation, and a value obtained by the integration of the presumed values is regarded as the presumed number of particles on the wafer:

$$N = \Sigma K_i \times 1/\alpha_i \times \beta_i \times P_i$$

where N is the number of particles on the wafer, K is an adjustment factor, α is an S/N ratio, β is a sensitivity, and P is a characteristic value in new time-series data.

Here, if presumed values obtained for the respective characteristic values are integrated as they are, the number of particles on the wafer N is a very large value, and hence as expressed by the above equation, the presumed values (1/α× β×P) obtained for the respective characteristic values are multiplied by the adjustment factor K so that they can be adjusted to appropriate values.

Moreover, even if presumed values are obtained using a correlative relationship with great variations, the statistical reliability of the presumed values is low, and hence as expressed by the above equation, the presumed values obtained for the respective characteristic values are multiplied by an inverse of the S/N ratio. That is, the greater the variations in the correlative relationship, the lower the evaluations given to the presumed values.

In the present embodiment, the number of particles on the wafer is presumed from time-series data on the total number of discharged particles in the above described manner (interior situation presuming step).

According to the method of presuming interior situation of process chamber of the present embodiment, characteristic values (a starting point at which the threshold value starts to be exceeded, an ending point at which the threshold value is last exceeded, an integrated time period for which the threshold value is exceeded, and the number of times the threshold value is exceeded) associated with the gas impact force mode, the gas viscous force mode, and the electrostatic force mode are extracted from time-series data on the total number of discharged particles, the correlative relationship (sensitivities and variations) between the characteristic values and the number of particles on the wafer is calculated, and further, the number of particles on the wafer is presumed based on the calculated correlative relationship and the characteristic values in new time-series data. Because the characteristics of the gas impact force mode, the gas viscous force mode, and the electrostatic force mode are prominently represented in a starting point at which the threshold value starts to be exceeded, an ending point at which the threshold value is last exceeded, an integrated time period for which the threshold value is exceeded, and the number of times the threshold value is exceeded, the number of particles on the wafer is presumed using the characteristic values that prominently represent the characteristics of the modes. Thus, the effects of the superposition of the numbers of particles removed in the respective modes on the presumption of the number of particles on the wafer can be reduced, and as a result, the number of particles on the wafer can be accurately presumed using the total number of discharged particles.

Moreover, according to the a method of presuming interior situation of process chamber of the present embodiment, the greater the variations in the correlative relationship on calculated characteristic values and the number of particles on the wafer, the lower the evaluations given to presumed values obtained from the correlative relationship and the characteristic values in new time-series data. For this reason, presumed values obtained from characteristic values that are not closely related to the number of particles on the wafer are given low evaluations. Thus, the number of particles on the wafer is presumed by preferentially using characteristic values that are closely related to the number of particles on the wafer, and as a result, the accuracy of the presumption can be improved.

Moreover, according to the method of presuming interior situation of process chamber of the present embodiment, it is preferred that a plurality of threshold values for extracting characteristic values from time-series data on the total number of discharged particles are set. This can increase the number of kinds of characteristic values for use in presuming the number of particles on the wafer and thus improve the statistical reliability of the presumption.

The present inventors observed a large number of time-series data on the total number of discharged particles as shown in FIG. 3, and found that in the case where the usage condition of the process chamber 11 differs, the pattern in which particles are produced differs even if the same NPPC sequence is carried out. For example, if the NPPC sequence is carried out after the plasma processing is repeatedly carried out using a process gas that tends to cause polymer to deposit inside the process chamber 11 when used in the plasma processing, a large amount of particles are discharged, but on the other hand, even if the NPPC sequence is carried out after the dry cleaning is carried out, particles are hardly discharged. It is thus preferred the extraction of the_characteristic values from time-series data on the total number of discharged particles and the calculation of the correlative relationship between the characteristic values and the number of particles on the wafer are carried out according to usage conditions. By differentiating between the use of the correlative relationships for use in presuming the number of particles on the wafer according to the usage conditions of the process chamber 11, the accuracy of the presumption can be improved.

Moreover, although in the present embodiment described above, time-series data on the total number of discharged particles is used, time-series data that can be used to presume the number of particles on the wafer is not limited to this, but any time-series data may be used insofar as it is roughly related to the number of particles on the wafer. Examples of such time-series data include time-series data on the situation of emission in the process chamber 11 observed by a plasma emission monitor, time-series data on a reflected wave of radio frequency voltage applied to the mounting stage 12, and time-series data on the temperature of an atmosphere inside the process chamber 11 measured by a temperature sensor.

Next, a description will be given of a method of presuming interior situation of process chamber according to a second embodiment of the present invention.

The present embodiment is basically the same as the first embodiment described above in terms of construction and operation, differing from the first embodiment only in that the interior situation of the process chamber to be presumed is not the number of particles on the wafer. Features of the construction and operation that are the same as in the first embodiment will thus not be described, only features that are different from those of the first embodiment being described below.

Based on the fact that in the case where the usage condition of the process chamber 11 differs, the pattern in which particles are produced differs even if the same NPPC sequence is carried out, the present inventors inferred that the pattern in which particles are produced also differs if the interior situation of the process chamber 11 differs.

Figure 8A:
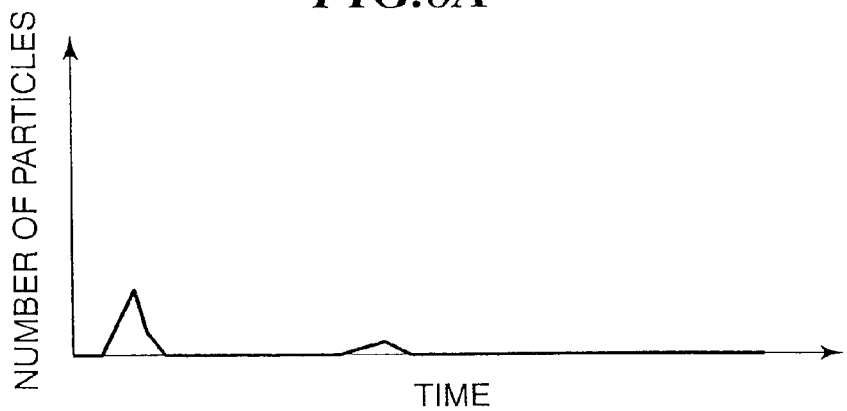
Figure 8B:
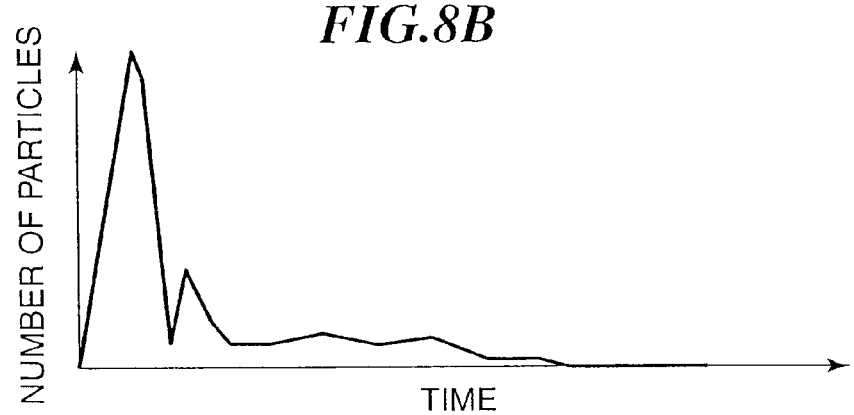
Figure 8C:
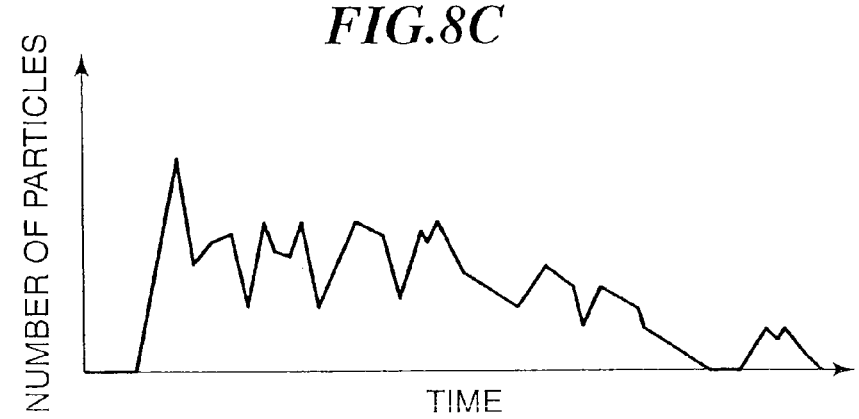

Thus, the present inventors obtained time-series data on the total number of discharged particles when the NPPC sequence was carried out in the case that the interior situation of the process chamber was a normal situation (a situation in which almost no particles existed), the case that the interior situation of the process chamber was a situation in which particles had been suddenly produced, and the case that the interior situation of the process chamber was a situation in which maintenance of the process chamber was required (a certain amount of particles existed), and ascertained that the forms of the time-series data were different as shown in FIGS. 8A to 8C.

FIG. 8A shows time-series data in the case that the interior situation of the process chamber 11 is a normal situation. In this case, because almost no particles exist in the process chamber 11, almost no particles are removed in the gas impact force mode, the gas viscous force mode, and the electrostatic force mode even if the NPPC is carried out. Thus, time-series data in which particles were hardly discharged over a whole period of the NPPC sequence was obtained.

FIG. 8B shows time-series data in the case that the interior situation of the process chamber 11 is a situation in which particles have been suddenly produced. In this case, only a short time period has elapsed since particles became attached to the surfaces of the component parts, and hence the particles easily separate from the surfaces of the component parts. Thus, if the NPPC sequence is carried out, almost all of the particles are removed in the gas impact force mode. As a result, time-series data in which a large amount of particles were discharged in an initial stage of the NPPC sequence was obtained.

FIG. 8C shows time-series data in the case that the interior situation of the process chamber 11 is a situation in which maintenance of the process chamber is required. In this case, a certain number of particles became attached to the surfaces of the component parts, and a certain time period has elapsed since the particles became attached to the surfaces of the component parts. For this reason, the particles do to separate in one stroke from the surfaces of the component parts, but gradually separate from the surfaces of the component parts. Thus, if the NPPC sequence is carried out, the particles are removed mainly in the gas viscous force mode and the electrostatic force mode. As a result, time-series data in which particles were discharged over a relatively long time period in the NPPC sequence was obtained.

As described above, the interior situations of the process chamber 11 are closely related to the modes of the NPPC sequence (the gas impact force mode, the gas viscous force mode, and the electrostatic force mode).

Here, because the number of particles removed in the gas impact force mode, the number of particles removed in the gas viscous force mode, and the number of particles removed in the electrostatic force mode are superposed in time-series data on each interior situation, it is difficult to recognize the number of particles removed in each mode directly from time-series data on each interior situation. Thus, it is difficult to obtain data that represents the characteristics of each interior situation directly from time-series data.

On the other hand, as is the case with the first embodiment described above, by extracting characteristic values (a starting point at which the threshold value starts to be exceeded, an ending point at which the threshold value is last exceeded, an integrated time period for which the threshold value is exceeded, and the number of times the threshold value is exceeded) associated with the modes from time-series data on each interior situation, a group of characteristic values that represent the characteristics of the respective interior situations can be obtained.

In the present embodiment, the interior situation of the process chamber 11 is presumed using a group of characteristic values that represent the characteristics of each interior situation.

Specifically, first, regarding a plurality of interior situations of the process chamber 11 (a normal situation, a situation in which the particles have been suddenly produced, and a situation in which maintenance of the process chamber 11 is required), a starting point at which a threshold value starts to be exceeded, an ending point at which the threshold value is last exceeded, an integrated time period for which the threshold value is exceeded, and the number of times the threshold value is exceeded are extracted from each time-series data to create in advance a group of characteristic values that represent the characteristics of the interior situations (characteristic value group creating step). At this time, it is preferred that to improve statistical reliability, acquisition of time-series data on each interior situation during the execution of the NPPC sequence is carried out a plurality of times, and characteristic values are extracted from a plurality of time-series data so as to increase the n number of each characteristic value.

Then, characteristic values (a starting point at which the threshold value starts to be exceeded, an ending point at which the threshold value is last exceeded, an integrated time period for which the threshold value is exceeded, and the number of times the threshold value is exceeded) (characteristic values in new time-series data on the number of particles) are extracted from time-series data on the total number of particles in the NPPC sequence that is newly carried out (hereinafter referred to as the "new time-series data"), and the interior situation of the process chamber 11 is presumed based on the degree of consistency between the groups of characteristic values that are created in advance and represent the respective interior situations and the characteristic values on the new time-series data (interior situation presuming step).

In the present embodiment, Mahalanobis' generalized distances as multidimensional distances are used as the degrees of consistency, and an MT method is used in presuming the interior situation of the process chamber 11 based on the degree of consistency.

Figure 9:
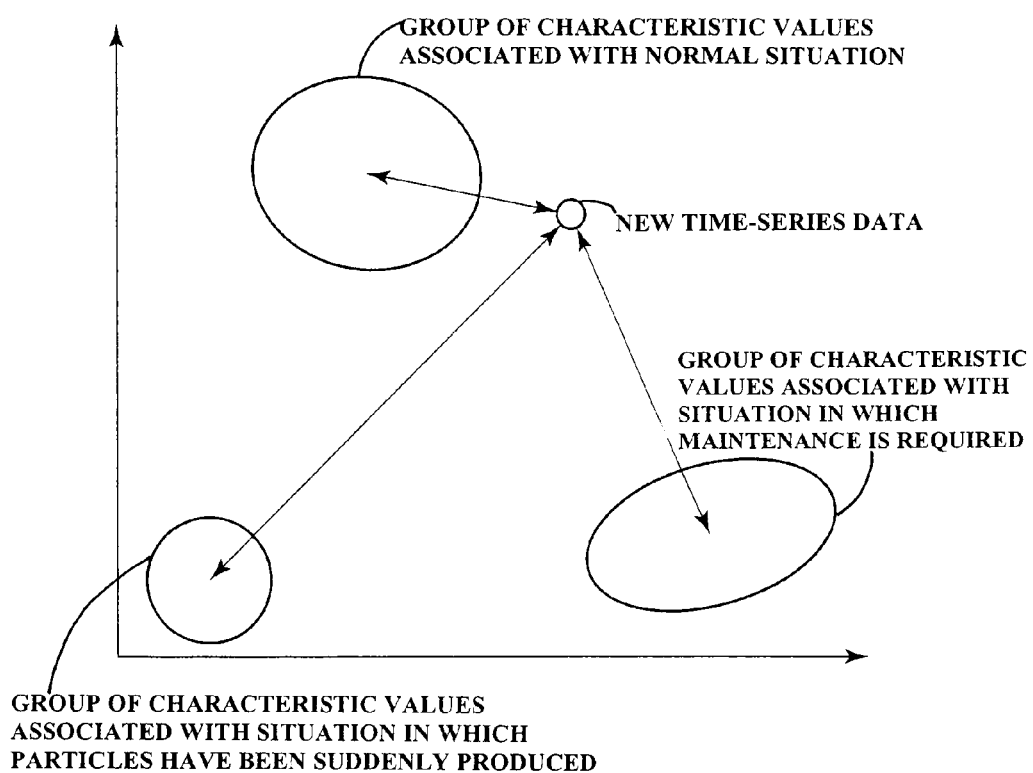
FIG. 9 is a view useful in explaining a method of presuming interior situation of process chamber using an MT method.

FIG. 9 is a view useful in explaining a method of presuming interior situation of process chamber using the MT method. It should be noted that because at least four characteristic values (a starting point at which the threshold value starts to be exceeded, an ending point at which the threshold value is last exceeded, an integrated time period for which the threshold value is exceeded, and the number of times the threshold value is exceeded) are extracted from time-series data, a group of characteristic values that represent characteristics of each interior situation exists in a multidimensional space not less than a four-dimensional space, but for the convenience of explanation, it is assumed in FIG. 9 that the groups of characteristic values exist in a two-dimensional space.

Referring to FIG. 9, first, the groups of characteristic values that represent the characteristics of the respective interior situations created in advance are arranged in a two-dimensional space (indicated by ovals in the figure). Then, the characteristic values in the new time-series data are plotted (indicated by "○" in the figure), and Mahalanobis' generalized distances (indicated by arrows in the figure) between the groups of characteristic values that represent characteristics of the respective interior situations and the characteristic values in the new time-series data are obtained. Then, it is presumed that the interior situation (one of the following: the normal situation, the situation in which the particles have been suddenly produced, and the situation in which maintenance of the process chamber 11 is required) corresponding to the group of characteristic values whose Mahalanobis' generalized distance to the characteristic value in new time-series data is the shortest is an interior situation of the chamber at a time point at which the NPPC sequence has been newly carried out.

According to the method of presuming interior situation of process chamber of the present embodiment, the characteristic values (a starting point at which the threshold value starts to be exceeded, an ending point at which a threshold value is last exceeded, an integrated time period for which a threshold value is exceeded, and the number of times a threshold value is exceeded) associated with the gas impact force mode, the gas viscous force mode, and the electrostatic force mode are extracted from the time-series data on the total number of discharged particles, the characteristic values are extracted from the time-series data on the interior situations of the process chamber 11 (a normal situation, a situation in which the particles have been suddenly produced, and a situation in which maintenance of the process chamber 11 is required) to create in advance groups of characteristic values that represent the characteristics of the respective interior situations, and further, the interior situation of the process chamber is presumed based on the degrees of consistency between the groups of characteristic values that are created in advance and represent the respective interior situations, and the characteristic values on the new time-series data. Because a starting point at which the threshold value starts to be exceeded, an ending point at which a threshold value is last exceeded, an integrated time period for which a threshold value is exceeded, and the number of times a threshold value is exceeded prominently represent the characteristics of the gas impact force mode, the gas viscous force mode, and the electrostatic force mode, the interior situation of the process chamber 11 is presumed using the characteristic values that prominently represent the characteristics of each mode. Thus, the effects of the superposition of the numbers of particles removed in the respective modes on the interior situation of the process chamber 11 can be reduced, and hence the interior situation of the process chamber 11 can be accurately presumed using the number of particles discharged from the interior of the process chamber 11.

In the a method of presuming interior situation of process chamber according to the present embodiment described above, because the degrees of consistency are the Mahalanobis' generalized distance between the groups of characteristic values that represent the characteristics of the respective interior situations and are created in advance and the characteristic values in the new time-series data, the interior situation of the process chamber 11 can be easily presumed.

Moreover, in the a method of presuming interior situation of process chamber according to the present embodiment described above, the interior situation of the process chamber 11 can be presumed based on the degree of consistency using the MT method. Because the MT method has a high statistical reliability, the accuracy with which the interior situation of the process chamber 11 is presumed can be improved.

It should be noted that in the present embodiment as well, it is preferred that a plurality of threshold values for extracting characteristic values from time-series data on the total number of discharged particles are set as is the case with the first embodiment. Also, for example, time-series data on the situation of emission inside the process chamber 11 observed by a plasma emission monitor, time-series data on a reflected wave of radio frequency voltage applied to the mounting stage 12, time-series data on the temperature of an atmosphere inside the process chamber 11 measured by a temperature sensor may be used in presuming the interior situation of the process chamber 11.

Moreover, it is to be understood that the object of the present invention may also be accomplished by supplying a computer, for example, a controller of the substrate processing apparatus 10 or a external server connected to the substrate processing apparatus 10 with a storage medium in which a program code of software, which realizes the functions of any of the above described embodiments is stored, and causing a CPU of the computer to read out and execute the program code stored in the storage medium.

In this case, the program code itself read from the storage medium realizes the functions of any of the above described embodiments, and hence the program code and the storage medium on which the program code is stored constitute the present invention.

Examples of the storage medium for supplying the program code include a medium capable of storing the above program code, for example, a RAM, an NV-RAM, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a nonvolatile memory card, and a ROM. Alternatively, the program code may be supplied by downloading from another computer, a database, or the like, not shown, connected to the Internet, a commercial network, a local area network, or the like.

Further, it is to be understood that the functions of any of the above described embodiments may be accomplished not only by executing a program code read out by a computer, but also by causing an OS (an operating system) or the like which operates on a CPU to perform a part or all of the actual operations based on instructions of the program code.

Further, it is to be understood that the functions of any of the above described embodiments may be accomplished by writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

Further, the form of the program may be an object code, a program code executed by an interpreter, or a script data supplied to an OS.

Next, a description will be given of an example of the present invention.

EXAMPLE

First, after the plasma processing was carried out a plurality of times in the substrate processing apparatus 10, the NPPC sequence was carried out, and the ISPM 15 counted the number of discharged particles flowing in the exhaust pipe 14.

Then, the method of presuming interior situation of process chamber according to the first embodiment described above was carried out to presume the number of particles on the wafer, and the presumed number of particles on the wafer was compared with the actual number of particles on the wafer. As a result, it was found that the correlation coefficient of the presumed number of particles on the wafer and the actual number of particles on the wafer was 0.888.

Comparative Example

Next, as is the case with the example, after the plasma processing was carried out a plurality of times in the substrate processing apparatus 10, the NPPC sequence was carried out, and the ISPM 15 counted the number of discharged particles flowing in the exhaust pipe 14.

Then, the number of discharged particles counted by the ISPM 15 and the actual number of particles on the wafer was compared, and it was found that the correlation coefficient of the counted number of discharged particles and the actual number of particles on the wafer was 0.0448.

Thus, it was found that the interior situation of the process chamber 11 can be accurately presumed if characteristic values associated with the modes of the NPPC sequence are extracted from time-series data on the total number of discharged particles, the correlative relationship between the characteristic values and the actual number of particles on the wafer is calculated, and further, the number of particles on the wafer is presumed based on the calculated correlative relationship and characteristic values in new time-series data.

What is claimed is:

1. A method of presuming interior situation of process chamber that presumes an interior situation of a process chamber in which a substrate is accommodated and subjected to predetermined processing and to which a particle removing sequence comprising a plurality of particle removing modes is applied, the method being carried out by an apparatus that is comprised of a computer programmed to perform the method and to presume an interior situation of the process chamber, comprising:

a characteristic value extracting step of extracting a plurality of characteristic values associated with the respective particle removing modes based on the interior situation of the process chamber in each of the plurality of the particle removing modes and time-series data on a number of particles discharged from the interior of the process chamber; and an interior situation presuming step of presuming the interior situation of the process chamber by calculating a presumed value of a number of particles on the substrate based on each of the plurality of characteristic values in new time-series data on the number of particles and by integrating each of the calculated presumed values of the number of particles on the substrate in consideration of statistical reliability of a relationship between each of the characteristic values and the number of the particles on the substrate, wherein the plurality of characteristic values are the number of times the time-series data exceeds a predetermined threshold value, a time at which the time-series data exceeds the predetermined threshold value for the first time, a time at which the time-series data last becomes smaller than the predetermined threshold value, and an integrated time period for which the time-series data exceeds the predetermined threshold value.

2. A method of presuming interior situation of process chamber as claimed in claim 1, wherein the plurality of particle removing modes include a mode using a gas impact force, a mode using a gas viscous force, and a mode using an electrostatic force.

3. A method of presuming interior situation of process chamber as claimed in claim 2, wherein a plurality of predetermined threshold values are set.

4. A method of presuming interior situation of process chamber as claimed in claim 1, wherein in said interior situation presuming step, the greater variations in the relationship between each of the characteristic values and the number of particles on the substrate become, the lower evaluation is given to the presumed value of the number of particles on the substrate.

5. A method of presuming interior situation of process chamber that presumes an interior situation of a process chamber in which a substrate is accommodated and subjected to predetermined processing and to which a particle removing sequence comprising a plurality of particle removing modes is applied, the method being carried out by an apparatus that is comprised of a computer programmed to perform the method and to presume an interior situation of the process chamber, comprising:

a characteristic value extracting step of extracting characteristic values associated with the respective particle removing modes from time-series data on the number of particles discharged from an interior of the process chamber for the each interior situation of the process chamber;

a characteristic value group creating step of creating respective groups of the characteristic values associated with each of the plurality of the interior situations of the process chamber by dividing the extracted characteristic values in accordance with the each interior situation of the process chamber;

a distance calculating step of calculating multidimensional distances between each of the created groups of the characteristic values and the characteristic values in new time-series data on the number of particles; and an interior situation presuming step of ascribing the present interior situation of the process chamber to the interior situation of the process chamber associated with the characteristic value group whose multidimensional distance is the shortest, wherein the characteristic values are the number of times the time-series data exceeds a predetermined threshold value, a time at which the time-series data exceeds the predetermined threshold value for the first time, a time at which the time-series data last becomes smaller than the predetermined threshold value, and an integrated time period for which the time-series data exceeds the predetermined threshold value.

6. A method of presuming interior situation of process chamber as claimed in claim 5, wherein the multidimensional distance is Mahalanobis' generalized distance.

7. A method of presuming interior situation of process chamber as claimed in claim 5, wherein the plurality of interior situations of the process chamber are a normal situation, a situation in which the particles have been suddenly produced, and a situation in which maintenance of the process chamber is required.

8. A method of presuming interior situation of process chamber as claimed in claim 5, wherein the plurality of particle removing modes include a mode using a gas impact force, a mode using a gas viscous mode, and a mode using an electrostatic force.

9. A method of presuming interior situation of process chamber as claimed in claim 8, wherein a plurality of predetermined threshold values are set.

10. A non-transitory computer-readable storage medium storing a program for causing a computer to carry out a method of presuming interior situation of process chamber that presumes an interior situation of a process chamber in which a substrate is accommodated and subjected to predetermined processing and to which a particle removing sequence comprising a plurality of particle removing modes is applied, the method of presuming interior situation of process chamber comprising:

a characteristic value extracting step of extracting a plurality of characteristic values associated with the respective particles removing modes based on the interior situation of the process chamber in each of the plurality of the particle removing modes and time-series data on a number of particles discharged from the interior of the process chamber; and an interior situation presuming step of presuming the interior situation of the process chamber by calculating a presumed value of a number of particles on the substrate based on each of the plurality of characteristic values in new time-series data on the number of particles and by integrating each of the calculated presumed values of the number of particles on the substrate in consideration of statistical reliability a relationship between each of the characteristic values and the number of particles on the substrate, wherein the plurality of characteristic values are the number of times the time-series data exceeds a predetermined threshold value, a time at which the time-series data exceeds the predetermined threshold value for the first time, a time at which the time-series data last becomes smaller than the predetermined threshold value, and an integrated time period for which the time-series data exceeds the predetermined threshold value.

11. A non-transitory computer-readable storage medium storing a program for causing a computer to carry out a method of presuming interior situation of process chamber that presumes an interior situation of a process chamber in which a substrate is accommodated and subjected to predetermined processing and to which a particle removing sequence comprising a plurality of particle removing modes is applied, the method of presuming interior situation of process chamber comprising:

a characteristic value extracting step of extracting characteristic values associated with the respective particle removing modes from time-series data on the number of particles discharged from an interior of the process chamber for the each interior situation of the process chamber;

a characteristic value group creating step of creating respective groups of the characteristic values associated with each of the plurality of the interior situations of the process chamber by dividing the extracted characteristic values in accordance with the each interior situation of the process chamber;

a distance calculating step of calculating multidimensional distances between each of the created groups of the characteristic values and the characteristic values in new time-series data on the number of particles; and an interior situation presuming step of ascribing the present interior situation of the chamber to the interior situation of the process chamber associated with the characteristic value group whose multidimensional distance is the shortest, wherein the characteristic values are the number of times the time-series data exceeds a predetermined threshold value, a time at which the time-series data exceeds the predetermined threshold value for the first time, a time at which the time-series data last becomes smaller than the predetermined threshold value, and an integrated time period for which the time-series data exceeds the predetermined threshold value.

* * * * *